United States Patent
Liaw

(10) Patent No.: US 7,812,400 B2
(45) Date of Patent: Oct. 12, 2010

(54) GATE STRIP WITH REDUCED THICKNESS

(75) Inventor: Jhon-Jhy Liaw, Hsin-Chu (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 138 days.

(21) Appl. No.: 11/725,404

(22) Filed: Mar. 19, 2007

(65) Prior Publication Data

US 2008/0230855 A1  Sep. 25, 2008

(51) Int. Cl.
  *H01L 23/48* (2006.01)
(52) U.S. Cl. .................. 257/369; 257/412; 257/413
(58) Field of Classification Search ............... 257/288, 257/369; 438/227, 202, 162, 637, 197
See application file for complete search history.

(56) References Cited

U.S. PATENT DOCUMENTS

| 5,633,523 A * | 5/1997 | Kato ............................ 257/369 |
| 5,882,965 A * | 3/1999 | Schwalke et al. ............ 438/227 |
| 2005/0176193 A1 * | 8/2005 | Kang et al. .................. 438/197 |

OTHER PUBLICATIONS

Yu et al., 1995, "Robust n+/p+ Dual-Gate CMOS Device Fabrication Using Dopant Drive-Out Technique", EDMS, pp. 5-2-5-5-2-8.*

S. Wolf, 1995, Silicon Processing for the VLSI Era vol. 3—The Submicron MOSFET, pp. 530-531 section 8.1.4 and p. 367 section 6.5.*

S. Wolf, 1995, Silicon Processing for the VLSI Era vol. 3—The Submicron MOSFET, p. 367-368 section 6.5.*

Yu et al. ("Robust n+/p+ Dual-Gate CMOS Device Fabrication Using Dopant Drive-Out Technique", 1994 EDMS, pp. 5-2-5-5-2-8, from hereinafter "Yu").*

\* cited by examiner

*Primary Examiner*—Thanh V Pham
*Assistant Examiner*—Errol Fernandes
(74) *Attorney, Agent, or Firm*—Slater & Matsil, L.L.P.

(57) ABSTRACT

A semiconductor structure with reduced inter-diffusion is provided. The semiconductor structure includes a semiconductor substrate; a first well region in the semiconductor substrate; a second well region in the semiconductor substrate; an insulating region between and adjoining the first and the second well regions; a gate dielectric layer on the first and the second well regions; and a gate electrode strip on the gate dielectric and extending from over the first well region to over the second well region. The gate electrode strip includes a first portion over the first well region, a second portion over the second well region, and a third portion over the insulating region. A thickness of the third portion is substantially less than the thicknesses of the first and the second portions.

18 Claims, 6 Drawing Sheets

GATE STRIP WITH REDUCED THICKNESS

TECHNICAL FIELD

This invention relates generally to semiconductor devices, and more particularly to metal-oxide-semiconductor devices and methods for forming the same.

BACKGROUND

In integrated circuit formation technologies, thermal budget, dopant concentration and dopant depth of source and drain regions are continuously reduced for short channel effect improvement. However, such reductions result in lower polysilicon gate dopant concentrations in metal-oxide-semiconductor (MOS) devices. When the dopant concentration in a polysilicon gate is lower than a threshold value, a depletion layer is induced at the interface between the polysilicon gate and the underlying gate dielectric, resulting in an increased effective dielectric thickness and a degraded saturation current.

In order to solve this problem, a pre-gate doping process was commonly used for improving the performance of MOS devices. In a typical pre-gate doping process, after the formation, but before the patterning, of a gate dielectric layer and a polysilicon layer, the polysilicon layer was implanted with desired dopants. An annealing was then performed to drive the dopants down and also to activate the dopants. This process increased the dopant concentration at the interface between polysilicon gates and the respective underlying gate dielectrics, and thus eliminated the depletion layers.

The conventional pre-doping process, however, suffers limitations. FIG. 1 illustrates a cross-sectional view of an intermediate stage in a conventional pre-doping process. P-well region 2 and n-well region 4 are separated from each other by shallow trench isolation (STI) region 6. Gate dielectric layer 8 is formed on p-well region 2, n-well region 4 and STI 6, followed by the formation of polysilicon layer 10. Mask 12 is formed to cover p-well region 2, and p-type dopants are implanted into polysilicon region $10_2$, which is over n-well region 4. Mask 12 is then removed, and mask 14 as shown in dotted lines, is formed. N-type dopants are implanted into polysilicon region $10_1$, which is over p-well region 2. An annealing is then performed to drive the implanted dopants, which are typically in an upper portion of polysilicon layer 10, down into the lower portion of polysilicon layer 10, as is symbolized by arrows 16.

Adversely, at the time the dopants are driven downward, an inter-diffusion, which is symbolized by arrow 18, also occurs. This causes the lateral diffusion of p-type dopants into polysilicon region $10_1$, and the lateral diffusion of n-type dopants into polysilicon region $10_2$. After the patterning of polysilicon layer 10 and dielectric layer 8, the gate poly of a resulting NMOS device will adversely contain p-type dopants, and the gate poly of a resulting PMOS device will adversely contain n-type dopants. The adversely diffused dopants neutralize portions of the desired dopants, causing the fluctuation in threshold voltages.

The above-discussed problem becomes worse in small-scale integrated circuits. For example, in integrated circuits formed using 65 nm technology, the clearance distance D between implanted p-type dopants and the gate poly of the neighboring NMOS device is only about 70 nm, while thickness T of polysilicon layer 10 is about 100 nm, which is even greater than the clearance distance D. The lateral diffusion is severe and cannot be ignored. The problem will increase in severity if lower-scale technologies are used. Therefore, this problem limits the improvement in future device performance and device optimization.

Accordingly, what is needed in the art are semiconductor structures and formation methods that incorporate pre-doping thereof to take advantage of the benefits associated with the increased dopant concentration while at the same time overcoming the deficiencies of the prior art.

SUMMARY OF THE INVENTION

In accordance with one aspect of the present invention, a semiconductor structure includes a semiconductor substrate; a first well region in the semiconductor substrate; a second well region in the semiconductor substrate; an insulating region between and adjoining the first and the second well regions; a gate dielectric layer on the first and the second well regions; and a gate electrode strip on the gate dielectric and extending from over the first well region to over the second well region. The gate electrode strip includes a first portion over the first well region, a second portion over the second well region, and a third portion over the insulating region. A thickness of the third portion is substantially less than the thicknesses of the first and the second portions.

In accordance with another aspect of the present invention, a semiconductor structure includes a semiconductor substrate; an n-type metal-oxide-semiconductor (NMOS) device and a p-type MOS (PMOS) device. The NMOS device includes a p-well region in the semiconductor substrate; a first gate dielectric on the p-well region; a first gate electrode on the first gate dielectric; and a first gate spacer on a sidewall of the first gate electrode. The PMOS device includes an n-well region in the semiconductor substrate; a second gate dielectric on the n-well region; a second gate electrode on the second gate dielectric; and a second gate spacer on a sidewall of the second gate electrode. The semiconductor structure further includes an insulating region adjoining the p-well region and the n-well region; and a recessed conductive region separating the first gate electrode and the second gate electrode. The recessed conductive region is over the insulating region only. The recessed conductive region has a thickness substantially less than the thicknesses of the first and the second gate electrodes.

In accordance with yet another aspect of the present invention, a semiconductor structure includes a semiconductor substrate; a p-well region in the semiconductor substrate; an n-well region in the semiconductor substrate; a shallow trench isolation (STI) region adjoining the p-well region and the n-well region, wherein the p-well region and the n-well region are spaced apart by the STI region; a gate dielectric strip extend from over the p-well region to over the STI region, and over the n-well region; a silicon-containing strip on the gate dielectric strip, wherein a recessed portion of the silicon-containing strip within a region directly over the STI region has a thickness less than thicknesses of portions of the silicon-containing strip over the p-well region and the n-well region by a thickness difference; an n-type source/drain region in the p-well region and adjacent the silicon-containing strip; and a p-type source/drain region in the n-well region and adjacent the silicon-containing strip.

In accordance with yet another aspect of the present invention, a method of forming a semiconductor structure includes providing a semiconductor substrate; forming a first well region in the semiconductor substrate; forming a second well region in the semiconductor substrate; forming an insulating region adjoining the first and the second well regions; forming a gate dielectric on the first and the second well regions;

and forming a gate electrode strip on the gate dielectric. The gate electrode strip extends from over the first well region to over the second well region. The gate electrode strip comprises a first portion over the first well region, a second portion over the second well region, and a third portion over the insulating region. The method further includes recessing a top surface of the third portion to a thickness less than thicknesses of the first and the second portions.

In accordance with yet another aspect of the present invention, a method of forming a semiconductor structure includes providing a semiconductor substrate; forming a first well region in the semiconductor substrate; forming a second well region in the semiconductor substrate; forming a shallow trench isolation (STI) region adjoining the first and the second well regions; forming a gate dielectric layer on the STI region and the first and the second well regions; forming a gate electrode layer on the gate dielectric layer; pre-doping a portion of the gate electrode layer to form a first pre-doped region, wherein the first pre-doped region is over the first well region, and over a portion of the STI region adjoining the first well region; pre-doping a portion of the gate electrode layer to form a second pre-doped region, wherein the second pre-doped region is over the second well region, and over a portion of the STI region adjoining the second well region; recessing an interface portion of the first and the second pre-doped regions, wherein the interface portion is over the STI region only; and performing an annealing after the step of recessing.

The advantageous features of the embodiments of the present invention include reduced inter-diffusion of pre-doped impurities in gate electrodes of MOS devices, improved threshold voltage control, improved device matching, and the ability for further down-scaling integrated circuits.

BRIEF DESCRIPTION OF THE DRAWINGS

For a more complete understanding of the present invention, and the advantages thereof, reference is now made to the following descriptions taken in conjunction with the accompanying drawings, in which.

DETAILED DESCRIPTION OF ILLUSTRATIVE EMBODIMENTS

The making and using of the presently preferred embodiments are discussed in detail below. It should be appreciated, however, that the present invention provides many applicable inventive concepts that can be embodied in a wide variety of specific contexts. The specific embodiments discussed are merely illustrative of specific ways to make and use the invention, and do not limit the scope of the invention.

Figure 1:
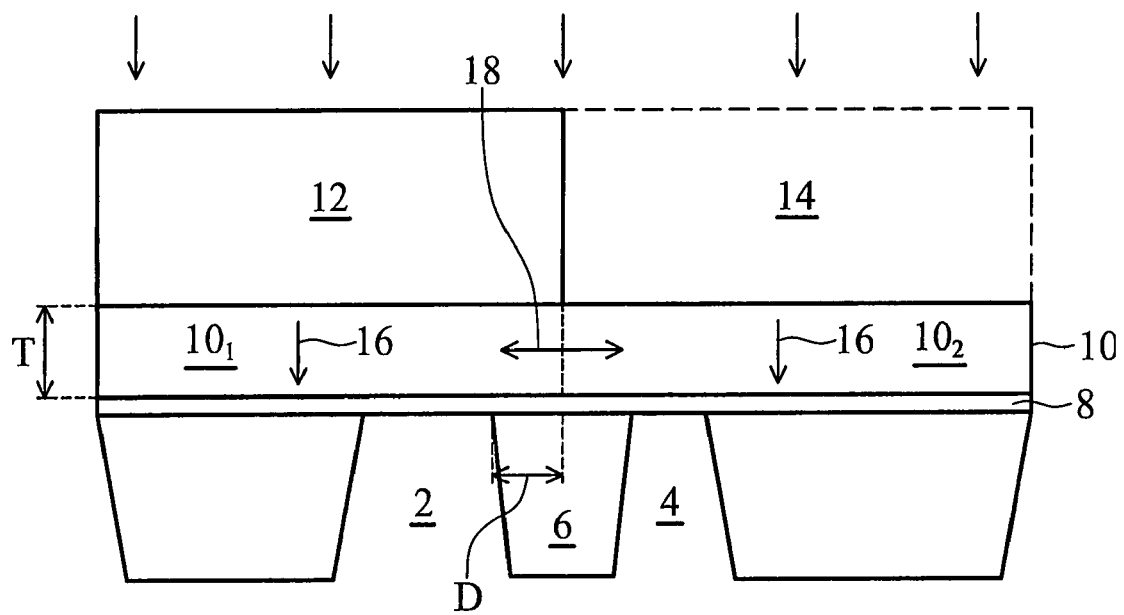
FIG. 1 illustrates a cross-sectional view of an intermediate stage in a conventional pre-doping process.
Figure 2:
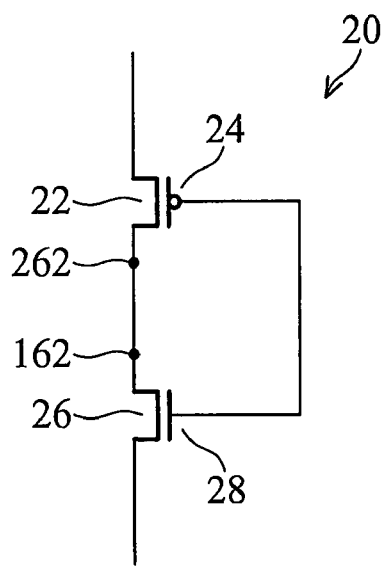
FIG. 2 illustrates a circuit diagram of a circuit having two interconnected MOS devices.

FIG. 2 illustrates a circuit diagram of an exemplary circuit 20, which includes a p-type metal-oxide-semiconductor (PMOS) device 22 connected to an n-type MOS (NMOS) device 26. Gate 24 of PMOS device 22 is connected to gate 28 of NMOS device 26. Drain 262 of PMOS device 22 is connected to drain 162 of NMOS device 26. Circuit 20 is commonly used in inverters, static random access memory cells, and the like. It is to be noted that circuit 20 is only an example used for explaining the concept of the present invention, and the concept of the present invention can be applied to many other circuits.

FIGS. 3 through 8C illustrate the intermediate stages of manufacturing an embodiment of the present invention, which embodiment implements the circuit shown in FIG. 2. The variations of the preferred embodiments are then discussed. Throughout the various views and illustrative embodiments of the present invention, like reference numbers are used to designate like elements.

Figure 3:
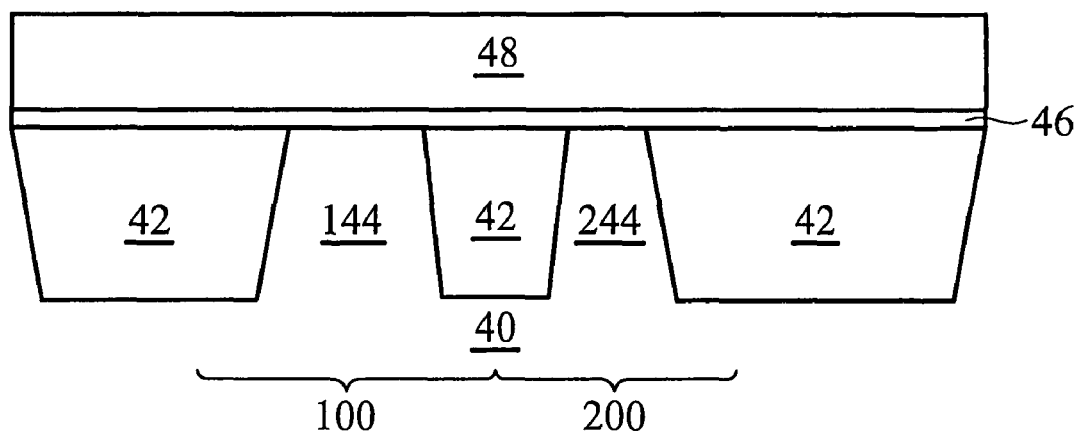
FIGS. 3 through 8C are cross-sectional views of intermediate stages in the manufacturing of the circuit shown in FIG. 2.

Referring to FIG. 3, substrate 40 is provided. Substrate 40 preferably comprises bulk silicon, although other commonly used structures and materials such as silicon-on-insulator (SOI), silicon alloys and group III and group IV compounds, can also be used. Substrate 40 includes NMOS region 100, which is used for forming NMOS device 26 in FIG. 2, and PMOS region 200, which is used for forming PMOS device 22. Shallow trench isolation (STI) regions 42 are formed in substrate 40, separating p-well region 144 and n-well region 244. As is known in the art, p-well region 144 may be formed by masking n-well region 244, and implanting p-type dopants into substrate 40. Similarly, n-well region 244 may be formed by masking p-well region 144, and implanting n-type dopants into substrate 40.

Gate dielectric layer 46 is formed on substrate 40. In the preferred embodiment, gate dielectric layer 46 has a high dielectric constant (k value), preferably greater than about 3.9. It preferably comprises silicon oxides, silicon nitrides, oxynitrides, dielectric metal oxides such as $HfO_2$, $HfZrO_x$, $HfSiO_x$, $HfTiO_x$, $HfAlO_x$, and combinations thereof. The preferred methods for forming gate dielectric layer 46 include chemical vapor deposition (CVD) techniques such as low temperature CVD (LTCVD), low pressure CVD (LPCVD), rapid thermal CVD (RTCVD), plasma enhanced CVD (PECVD), and other commonly used methods. Gate electrode layer 48, which preferably includes polysilicon, amorphous silicon, metal silicides, and the like, is formed on gate dielectric layer 46.

Figure 4:
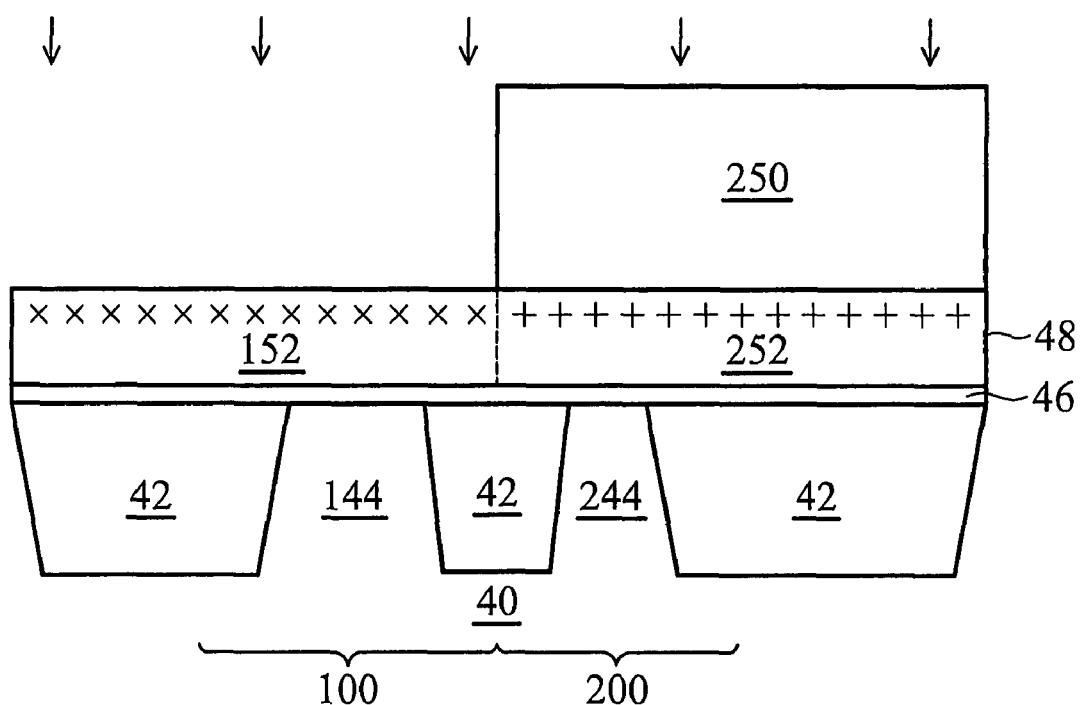

An n-type pre-doping is performed, as shown in FIG. 4. As is known in the art, the pre-doping of n-type or p-type impurities results in the reduction in the likelihood of poly-gate depletion. In the pre-doping, photo resist 250 is formed and patterned, covering PMOS region 200 while leaving NMOS region 100 exposed. An n-type dopant, such as phosphorous, arsenic, antimony, and the like, is implanted into gate electrode layer 48, forming n-type doped region 152. The implanted n-type dopant is symbolized with "x" marks. Photo resist 250 is then removed.

Similar to the formation of n-type doped region 152, p-type doped region 252 is formed, wherein the formation processes includes forming a photo resist (not shown) covering NMOS region 100 while leaving PMOS region 200 exposed, and implanting a p-type dopant (symbolized using "+" marks), such as boron, indium, and the like, into gate electrode layer 48. In an exemplary embodiment, n-type doped region 152 and p-type doped region 252 adjoin to each other, and both extending on the STI region 42 that joins p-well region 144 and n-well region 244.

Figure 5:
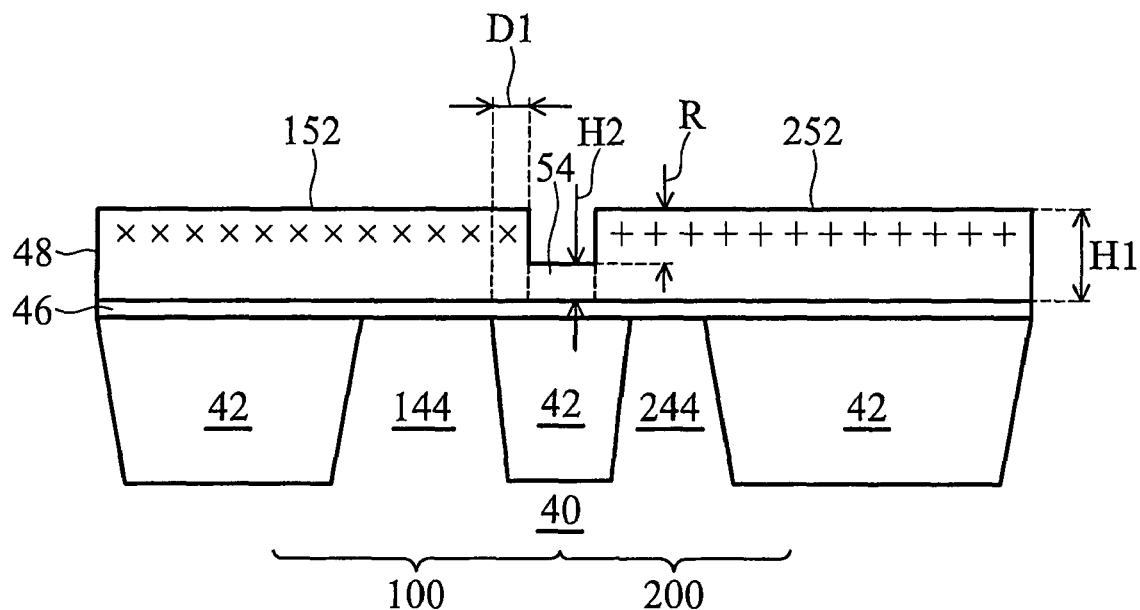

Referring to FIG. 5, an etching process is performed to remove a top portion of gate electrode layer 48, forming a recessed gate electrode region 54. Preferably, the removed portion is only directly over the adjoining STI region 42, which STI region 42 is between and adjoins p-well region 144 and n-well region 244. In an exemplary embodiment, recessed gate electrode region 54 and the boundary of STI region 42 have distance D1, which is preferably greater than about 50 Å. In another embodiment, distance D1 is such defined that after the subsequent silicidation process, the boundary of recessed gate electrode region 54 and/or the boundary of the resulting silicide layer do not extend to the gate region of the resulting PMOS and NMOS devices. The details are discussed in the subsequent paragraphs.

In an embodiment, recessing depth R is greater than about 200 Å. Since the pre-doped dopants are typically implanted into only a top portion of gate electrode layer 48, in alternative embodiments, recessing depth R is preferably greater than the depth of a region where most of the dopants are located. In yet other embodiments, the remaining height H2 of the recessed gate electrode region 54 is less than about 80 percent, and more preferably less than about 60 percent, of the height H1 of gate electrode layer 48. In yet other embodiments, thickness H2 of recessed gate electrode region 54 is less than about 400 Å. Further, thickness H2 may even be small enough, for example, between about 100 Å and about 150 Å, so that in the subsequent silicidation process, the recessed gate electrode region 54 is fully silicided.

Figure 6A:
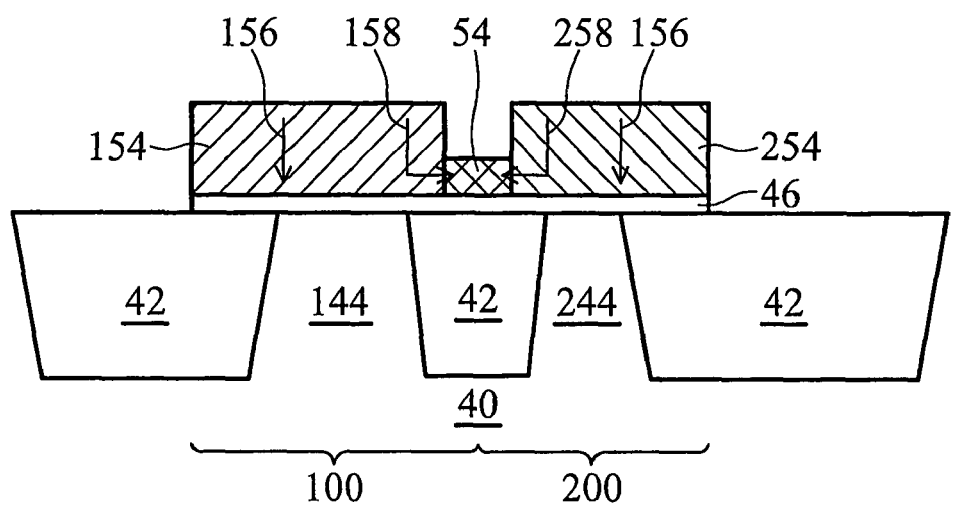
Figure 6B:
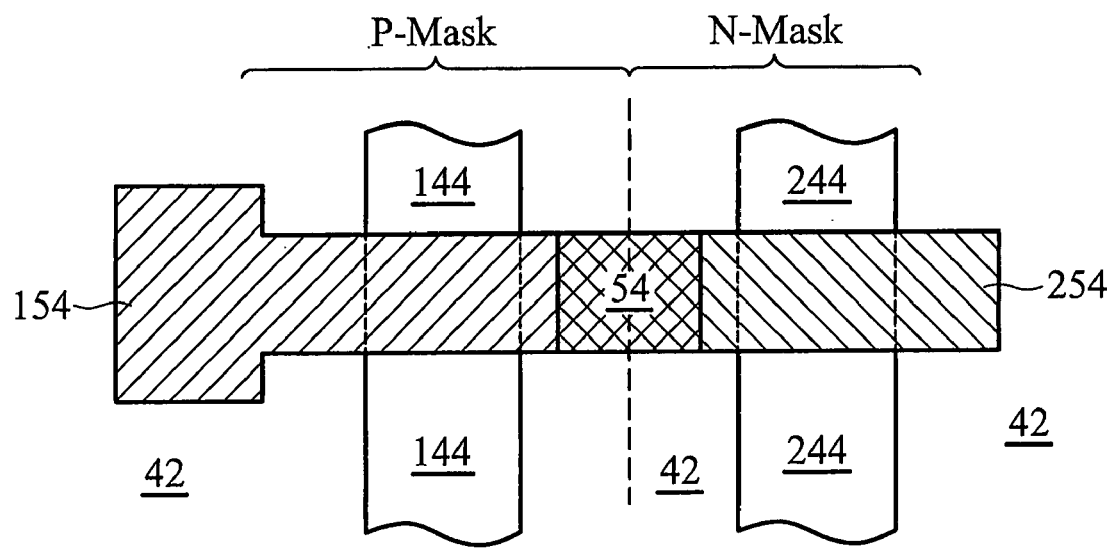

Gate electrode layer 48 and gate dielectric layer 46 are then patterned, forming a structure as shown in FIGS. 6A and 6B. FIG. 6A illustrates a cross-sectional view. Undesired portion of gate electrode layer 48 and gate dielectric layer 46 are removed, and the remaining portions of gate electrode layer 48 form gate electrodes 154 and 254, with recessed gate electrode region 54 therebetween. A top view of the structure is shown in FIG. 6B. Please note that p-well region 144 and n-well region 244 may be formed using a P-mask and an N-mask, which interface above the adjoining STI region 42. P-well region 144 and n-well region 244 each form a strip extending in a direction perpendicular to a longitudinal direction of the remaining gate electrode strip, which includes portions 154, 54 and 254.

Referring back to FIG. 6A, after the patterning, an annealing is performed, which activates the pre-doped dopants and drives the pre-doped dopants to the lower portion of gate electrodes 154 and 254, as symbolized by arrows 156 and 256. Meanwhile, n-type dopants in gate electrode 154 have the possibility of being diffused to gate electrode 254, and p-type dopants in gate electrode 254 have the possibility of being diffused to gate electrode 154, as symbolized by arrows 158 and 258, respectively. However, dopants have to diffuse down to lower than a top surface of the recessed gate electrode region 54 before they can be diffused to the other gate electrode. In addition, the height of the recessed gate electrode region 54 is less than the height of gate electrodes 154 and 254, resulting in a reduced cross-sectional area. This further increases the diffusion resistance. Accordingly, the inter-diffusion of dopants from one of the gate electrodes 154 and 254 to the other is significantly reduced. Furthermore, since the implanted dopants in the top portion of the recessed gate electrode region 54 are removed before the annealing, the inter-diffusion of dopants is further reduced.

Figure 7:
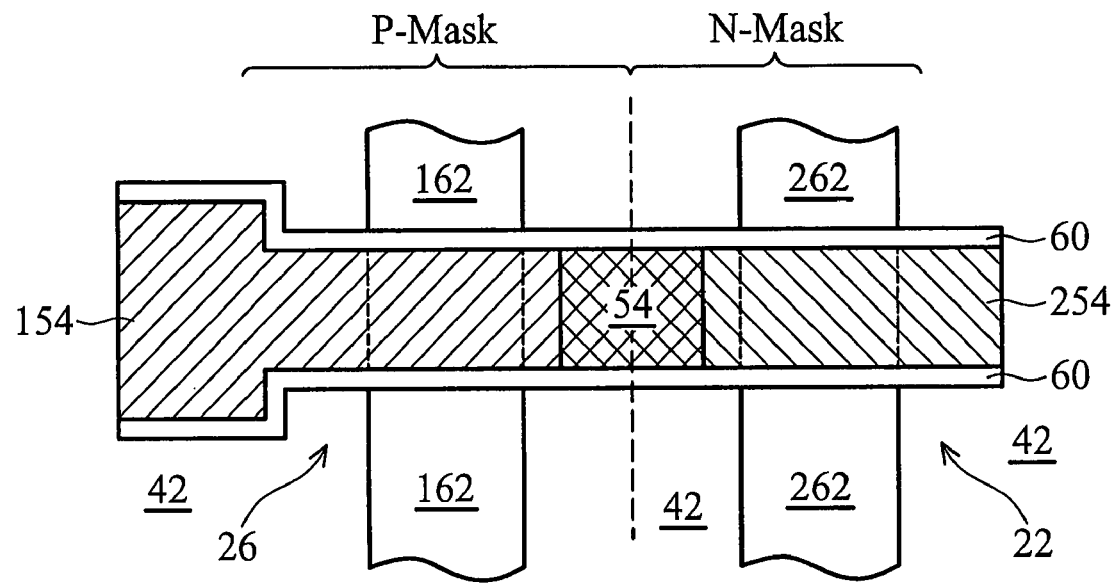

Referring to a top view shown in FIG. 7, in subsequent process steps, lightly doped source/drain regions (LDD regions, not shown), gate spacers 60 and source/drain regions 162 and 262 are formed, forming PMOS device 22 and NMOS device 26. The process steps are well known in the art, and thus are not repeated herein. Preferably, at the time the LDD regions and source/drain regions 162 and 262 are formed, the respective gate electrodes 154 and 254 are exposed to further implantations. As a result, gate electrodes 154 and 254 may receive more dopants, and my include dopants such as nitrogen, carbon, germanium, fluorine, oxygen, neon, helium, xenon, and combinations thereof.

Figure 8A:
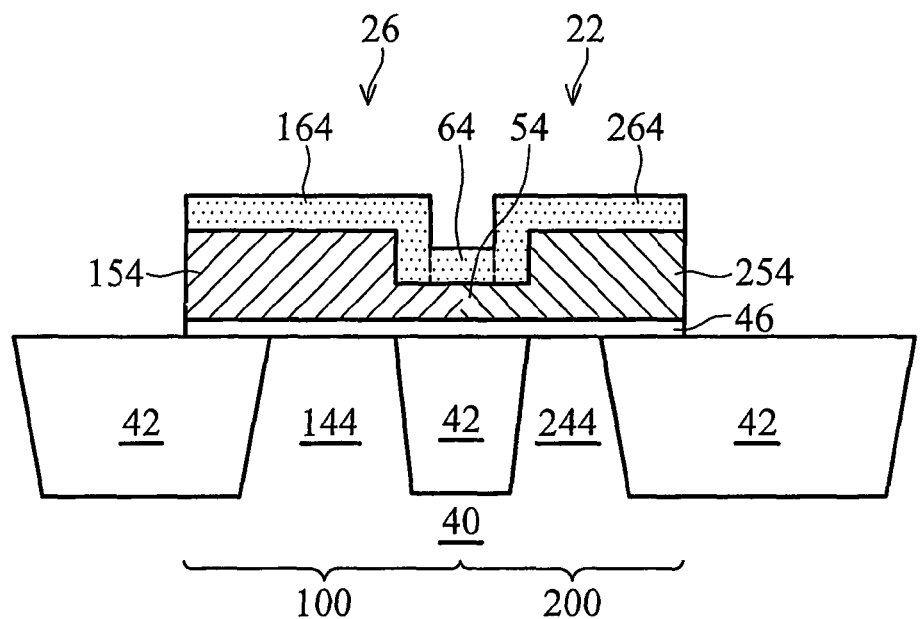
Figure 8B:
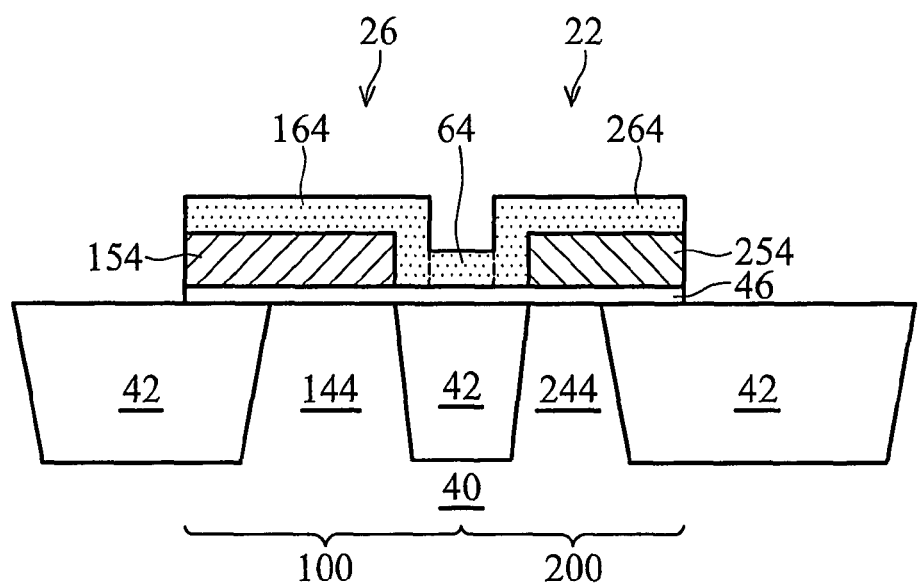
Figure 8C:
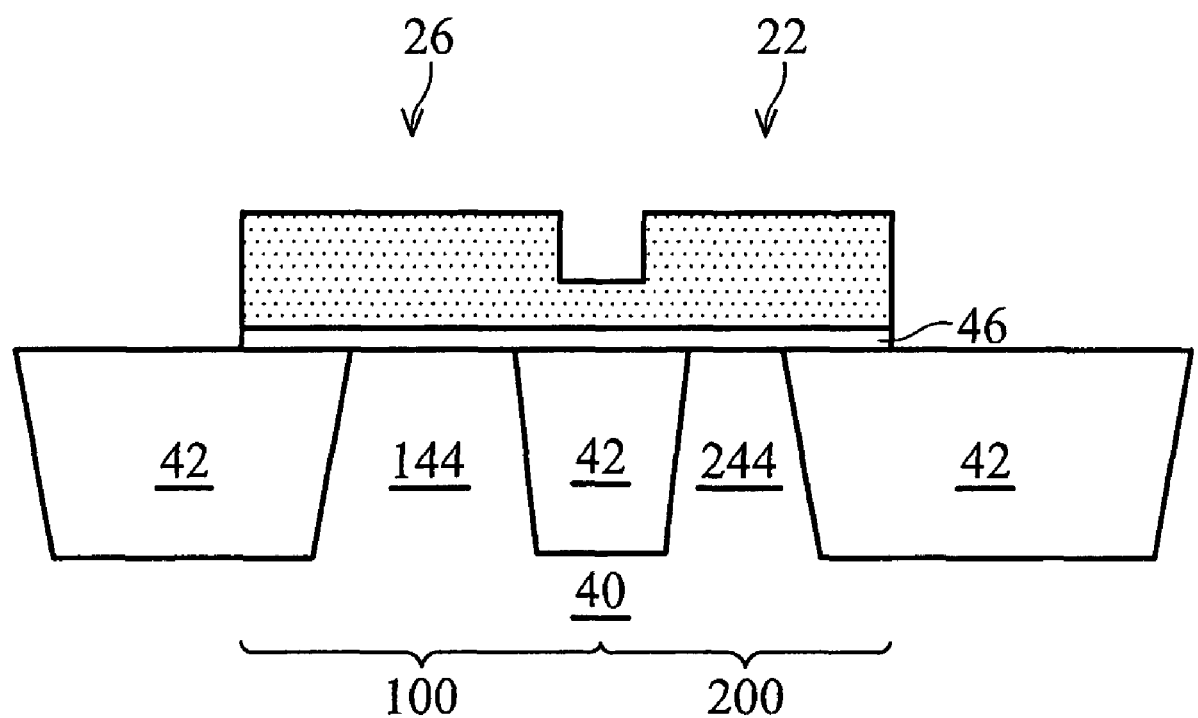

FIGS. 8A, 8B and 8C illustrate the formation of silicide regions 164, 264 and 64. In an exemplary embodiment, the silicide formation process includes blanket forming a metal layer (not shown), which may include nickel, cobalt, platinum, molybdenum, titanium, and like, and performing an annealing to react the metal layer with the underlying silicon-containing material to form silicide regions. The un-reacted metal layer is then removed. Although not shown in the cross-sectional view, silicide regions may also be formed on source/drain regions 162 and 262 (refer to FIG. 7). In FIG. 8A, the recessed gate electrode region 54 is partially silicided, forming silicide region 64, with a remaining portion of recessed gate electrode region 54 underlying silicide region 64. The thickness of the remaining portion of recessed gate electrode region 54 is preferably less than about 400 Å. In FIG. 8B, the recessed gate electrode region 54 is fully silicided. FIG. 8C further illustrates an embodiment wherein entire gate electrode regions 154 and 254 are fully silicided. Preferably, in FIGS. 8A through 8C, the interface regions between silicide region 64 and adjoining silicide regions 164 and 264 are located over STI region 42 only, but not over n-well region 144 and p-well region 244.

The embodiments of the present invention have several advantageous features. By recessing the portion of silicon-containing gate electrode layer between neighboring MOS devices, the inter-diffusion of pre-doped dopants is reduced. This is particularly advantageous for future-generation integrated circuits, in which the distance between the gate of a MOS device and respective neighboring well regions becomes increasingly smaller. Accordingly, the threshold voltage stability, and hence device matching ability, is improved by using embodiments of the present invention. The embodiments of the present invention may be used in the formation of static random access memory cells, which are sensitive to the threshold voltage stability. Additional advantageous features include improved short channel effects and lower sub-threshold leakage currents.

Although the present invention and its advantages have been described in detail, it should be understood that various changes, substitutions and alterations can be made herein without departing from the spirit and scope of the invention as defined by the appended claims. Moreover, the scope of the present application is not intended to be limited to the particular embodiments of the process, machine, manufacture, and composition of matter, means, methods and steps described in the specification. As one of ordinary skill in the art will readily appreciate from the disclosure of the present invention, processes, machines, manufacture, compositions of matter, means, methods, or steps, presently existing or later to be developed, that perform substantially the same function or achieve substantially the same result as the corresponding embodiments described herein may be utilized according to the present invention. Accordingly, the appended claims are intended to include within their scope such processes, machines, manufacture, compositions of matter, means, methods, or steps.

What is claimed is:

1. A SRAM structure comprising:
   a semiconductor substrate comprising at least one SRAM cell;
   a first n-well region in the semiconductor substrate;
   a first p-well region in the semiconductor substrate;
   an insulating region between and adjoining the first n-well and the first p-well regions and having a top surface coplanar with a surface of the semiconductor substrate;
   a gate dielectric layer on the first n-well and the first p-well regions; and
   a first gate electrode strip on the gate dielectric layer and extending from over the first p-well region to over the first n-well region, wherein the first gate electrode strip comprises a first portion over the first n-well region, a second portion over the first p-well region, and a third portion over the insulating region, wherein a thickness of the third portion is substantially less than thicknesses of the first and the second portions, the first gate electrode strip having a silicide layer, the silicide layer having a uniform thickness in the first portion, the second portion, and the third portion of the first gate electrode strip and directly contacting the first gate electrode strip.

2. The SRAM structure of claim 1, wherein the first gate electrode strip is for a pull down device and a pull up device.

3. The SRAM structure of claim 1, wherein the third portion comprises the silicide layer on a silicon-containing layer.

4. The SRAM structure of claim 3, wherein the silicon-containing layer has a thickness of less than about 400 Å.

5. The SRAM structure of claim 1, wherein the third portion comprises a silicide layer only, and wherein the first and the second portions each comprise the silicide layer on a polysilicon layer.

6. The SRAM structure of claim 1 further comprising:
a first gate spacer on a sidewall of the first portion of the first gate electrode strip;
a first source/drain region adjacent the first portion of the first gate electrode strip;
a second gate spacer on a sidewall of the second portion of the first gate electrode strip; and
a second source/drain region adjacent the second portion of the first gate electrode strip.

7. The SRAM structure of claim 1, wherein each of the first and the second portions of the first gate electrode strip comprises a silicide layer on a polysilicon layer, wherein the polysilicon layer in the first portion of the first gate electrode strip has net n-type dopants, and the polysilicon layer in the second portion of the first gate electrode strip has net p-type dopants.

8. A semiconductor structure comprising:
a semiconductor substrate having a top surface;
an n-type metal-oxide-semiconductor (NMOS) device comprising:
a p-well region in the semiconductor substrate;
a first gate dielectric on the p-well region;
a first gate electrode formed of a first material disposed on the first gate dielectric having first implanted dopant impurities to create a net first conductivity type; and
a first gate spacer on a sidewall of the first gate electrode;
a p-type MOS (PMOS) device comprising:
an n-well region in the semiconductor substrate;
a second gate dielectric on the n-well region;
a second gate electrode formed of the first material disposed on the second gate dielectric having second implanted dopant impurities to create a net second conductivity type; and
a second gate spacer on a sidewall of the second gate electrode;
an insulating region adjoining the p-well region and the n-well region and having a top surface that is substantially coplanar with the top surface of the semiconductor substrate;
a recessed conductive region that separates the first gate electrode and the second gate electrode, is formed of the same material as the first and second gate electrodes, is substantially free of the first and second implanted dopant impurities, lies over the insulating region only, and has a thickness substantially less than thicknesses of the first and the second gate electrodes; and a silicide layer extending over and directly contacting the first gate electrode, the second gate electrode, and the recessed conductive region, the silicide layer having a substantially constant thickness.

9. The semiconductor structure of claim 8, wherein:
the first gate electrode comprises a first silicide region on a first polysilicon region;
the second gate electrode comprises a second silicide region on a second polysilicon region; and
the recessed conductive region comprises a third silicide region on a third polysilicon region, wherein the third polysilicon region has a thickness substantially less than thicknesses of the first and the second polysilicon regions.

10. The semiconductor structure of claim 9, wherein the first, the second, and the third polysilicon regions are portions of a continuous polysilicon strip, and wherein the first, the second, and the third silicide regions are portions of the continuous polysilicon strip.

11. The semiconductor structure of claim 9, wherein the thickness of the third polysilicon region is less than about 80 percent of the thicknesses of the first and the second polysilicon regions.

12. The semiconductor structure of claim 9, wherein the thickness of the third polysilicon region is less than about 400 Å.

13. The semiconductor structure of claim 9, wherein a thickness of the third polysilicon region is less than thicknesses of the first and the second polysilicon regions by greater than about 200 Å.

14. The semiconductor structure of claim 9, wherein the first and the second gate electrodes and the recessed conductive region form a substantially straight line.

15. A semiconductor structure comprising:
a semiconductor substrate comprising an SRAM cell, the SRAM cell comprising;
a p-well region in the semiconductor substrate;
an n-well region in the semiconductor substrate;
a shallow trench isolation (STI) region adjoining the p-well region and the n-well region, wherein the p-well region and the n-well region are spaced apart by the STI region, an upper surface being substantially coplanar with an upper surface of the p-well and n-well regions;
a gate dielectric strip extending from over the p-well region to over the STI region, and over the n-well region;
a silicon-containing strip on the gate dielectric strip, wherein a recessed portion of the silicon-containing strip within a region directly over the STI region is substantially free from implanted dopant impurities and has a thickness less than thicknesses of portions of the silicon-containing strip over the p-well region having implanted dopant impurities to create a net first conductivity type and portions of the silicon-containing strip over the n-well region having implanted dopant impurities to create a net second conductivity type by a thickness difference, the silicon-containing strip having a silicided layer directly thereon, the silicided layer directly thereon being of equal thicknesses in the portions over the STI region, the p-well region, and the n-well region;
an n-type source/drain region in the p-well region and adjacent the silicon-containing strip; and
a p-type source/drain region in the n-well region and adjacent the silicon-containing strip.

16. The semiconductor structure of claim 15, wherein the thickness difference is greater than about 200 Å.

17. The semiconductor structure of claim 15, wherein the recessed portion of the silicon-containing strip has a thickness of less than about 400 Å.

18. The semiconductor structure of claim 15, wherein the recessed portion of the silicon-containing strip has a thickness of less than about 80 percent of the portions of the silicon-containing strip over the p-well region and the n-well region.

* * * * *

UNITED STATES PATENT AND TRADEMARK OFFICE
CERTIFICATE OF CORRECTION

PATENT NO. : 7,812,400 B2  Page 1 of 1
APPLICATION NO. : 11/725404
DATED : October 12, 2010
INVENTOR(S) : Liaw It is certified that error appears in the above-identified patent and that said Letters Patent is hereby corrected as shown below:

In Col. 7, line 10, claim 1, delete "strip and directly contacting the first gate electrode strip" and insert --strip--.
In Col. 8, line 1, claim 8, after over delete "and directly contacting".
In Col. 8, line 58, claim 15, delete "layer directly thereon" and insert --portion--.
In Col. 8, lines 58-59, claim 15, delete "layer directly thereon" and insert --portion--.

Signed and Sealed this
Fourth Day of January, 2011

David J. Kappos
*Director of the United States Patent and Trademark Office*